United States Patent

Stoffer

[15] 3,668,542

[45] June 6, 1972

[54] AUDIO COMPRESSION CIRCUIT

[72] Inventor: C. Daniel W. Stoffer, Don Mills, Ontario, Canada

[73] Assignee: Collins Radio Company, Cedar Rapids, Iowa

[22] Filed: Feb. 3, 1970

[21] Appl. No.: 8,258

[52] U.S. Cl. ....................................330/23, 330/29, 330/35

[51] Int. Cl. ........................................H03f 1/32, H03g 3/30

[58] Field of Search ...............................330/29, 35, 145, 23

[56] References Cited

UNITED STATES PATENTS 3,334,308 8/1967 Epstein et al. .......................330/29 X 3,449,684 6/1969 Kagan...............................330/145 X

OTHER PUBLICATIONS

J. Vanderkooy " Amplitude Modulator Using Operational Amplifier," – Wireless World p. 119, March 1969

*Primary Examiner*—Roy Lake
*Assistant Examiner*—Lawrence J. Dahl
*Attorney*—Warren H. Kintzinger and Robert J. Crawford

[57] ABSTRACT

An audio compressor using a P-channel junction field effect transistor (JFET) as a voltage controlled resistor at the input of an integrated circuit operational amplifier. Good frequency response and fast attack are provided since the gain control element is not a part of the biasing circuit with limitations due to settling time thereby avoided.

4 Claims, 4 Drawing Figures

Figure 1:
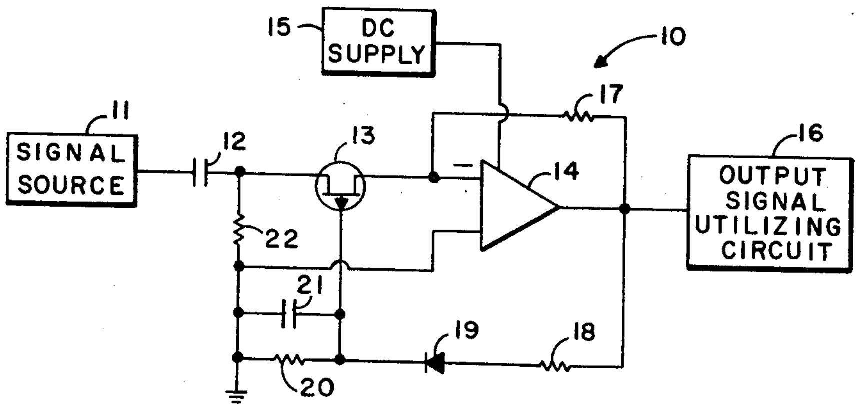

INVENTOR.
C. DANIEL W. STOFFER

BY Warren H. Kintzinger
ATTORNEY

AUDIO COMPRESSION CIRCUIT

This invention relates in general to audio compression circuits, and in particular, to an audio compression circuit with a field effect transistor (FET) as a voltage controlled amplifier input resistance in an operational amplifier feedback loop.

The attainment of good frequency response along with fast attack are incompatible with many audio compressor circuits particularly when simplicity along with reliability and easy maintainability are also required. This is especially so with audio compression circuits where the gain control element is a part of the biasing circuit with transients being coupled into the closed loop by the AGC system and with such transients decaying at a rate determined by the low frequency cutoff of the loop.

It is therefore, a principal object of this invention to provide an audio compression circuit having good frequency response along with relatively fast attack.

Another object with such an audio compression circuit is to provide gain control not affecting the dc bias and to be free of settling time limitations.

A further object is to provide such an audio compression circuit that is relatively simple, highly reliable and easily maintained.

Features of the invention useful in accomplishing the above objects include, in an audio compression circuit, use of a FET (field effect transistor) in the audio signal input path to an amplifier with an output AGC loop connection back to the gate electrode of the FET. It is an audio compression circuit where transient response problems are eliminated since the AGC voltage developed does not affect amplifier biasing to any significant degree.

A specific embodiment representing what is presently regarded as the best mode of carrying out the invention is illustrated in the accompanying drawing.

Figure 2:
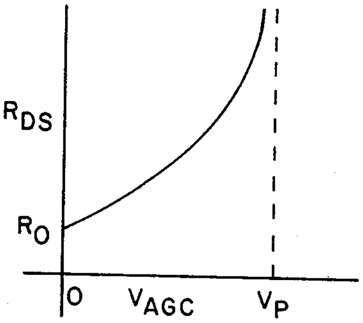
Figure 3:
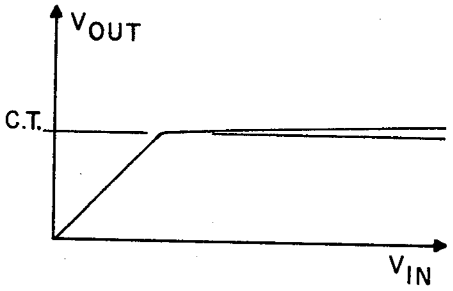
Figure 4:
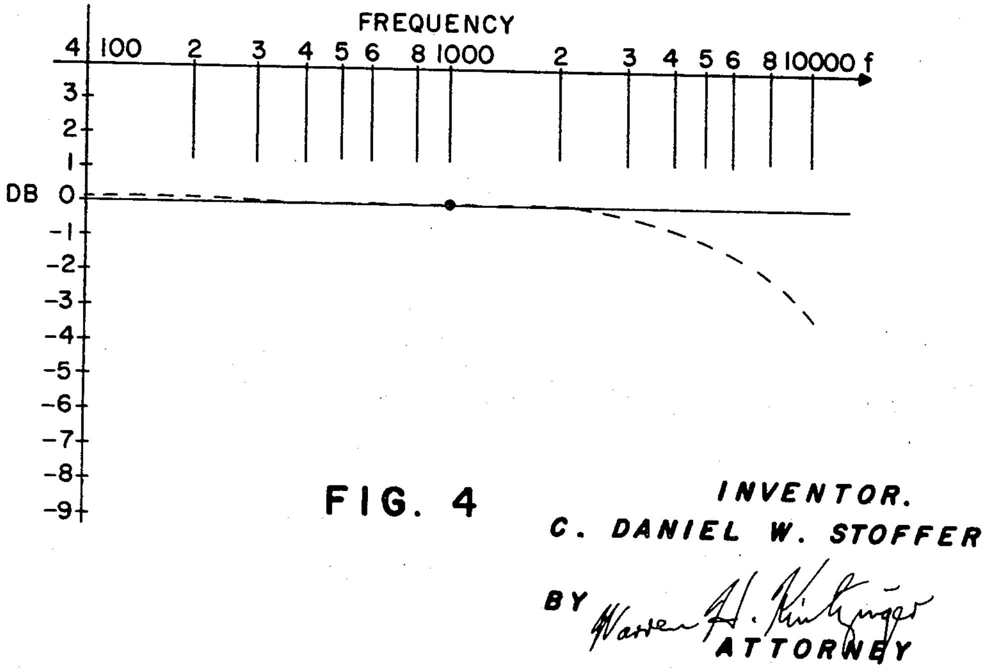

In the Drawing:

FIG. 1 represents a combination block and schematic showing of applicants audio compression circuit;

FIG. 2, a $R_{ds}$ (drain to source output resistance) vs $V_{AGC}$ (automatic gain control voltage) characteristic curve for an FET used in the audio compression circuit of FIG. 1;

FIG. 3, a voltage output vs voltage input (V out vs V in) characteristic curve attained with the audio compression circuit of FIG. 1; and, FIG. 4, voltage output ($V_o$) variation in db vs frequency for the audio compression circuit of FIG. 1.

Referring to the drawing:

The audio compression circuit 10 of FIG. 1 is shown to be fed an audio signal input from signal source 11 through capacitor 12 to a source electrode of FET 13 that in a specific circuit embodiment thereof was a P-channel JFET (junction field effect transistor). The drain electrode of FET 13 is connected in the signal path to operational amplifier 14 including a connection from dc supply 15, a ground connection, an output connection to output signal utilizing circuit 16, and a connection from the amplifier 14 output through resistor 17 back to the signal input connection of the amplifier. The output of amplifier 14 is also connected in an AGC loop serially through resistor 18 and diode 19 to the control electrode of JFET 13. The diode 19 is connected anode to resistor 18 and cathode to the FET 13 and also through resistor 20 and capacitor 21 in parallel to ground. The junction of signal input coupling capacitor 12 and JFET 13 is connected through resistor 22 to ground.

With the audio compressor circuit 10 of FIG. 1 the closed loop gain is:

$$A_V = \frac{-R_{17}}{R_{ds_{13}}}$$

with $R_{17}$ the resistance of resistor 17 and $R_{ds_{13}}$ the drain to source output resistance of JFET 13.

This is with the P-channel JFET 13 acting as a voltage controlled resistor with resistance varying from a minimum resistance $R_o$ with $V_{AGC}$ (automatic gain control voltage) applied at the gate electrode of FET 13 equal to 0. The source-to-drain resistance varies upward from $R_o$ with increasing $V_{AGC}$ toward infinity as $V_{AGC}$ approaches $V_p$ the (JFET pinch-off-voltage) in accord with the FET source-to-drain resistance characteristic curve of FIG. 2. This enables the audio compression circuit to have a voltage input to voltage output characteristic curve with a relatively sharp compression threshold knee as shown by FIG. 3.

Then with audio compression circuit 10 and $R_{ds}$ a function of $V_{AGC}$ as shown in FIG. 2, and since $V_{AGC} \cong \hat{V}_o$ it follows that:

$$A_V = -\frac{R_{17}}{R_o + f(\hat{V}_o)}$$

With varying $R_{ds}$ in turn varying the gain since the source-drain resistance is controlled by the rectified output via diode 19 the output voltage developed by the circuit varies its gain. Further, if the source drain resistance is some arbitrary monotonically increasing function of source-gate voltage as in FIG. 2 the gain of the circuit decreases as the output voltage increases. This relationship is as expressed by the most immediately foregoing equation with the source-drain resistance equation substituted in the gain equation. This includes a constant term $R_o$ plus a term indicating increasing resistance as a function of gate-source voltage derived by rectifying and filtering the output voltage via resistor 18, diode 19, resistor 20, and capacitor 21.

The circuit output builds up till $V_o$ or the resulting $V_{AGC}$ approaches the $V_p$ of the JFET after which the gain drops with increasing input (refer again also to FIG. 3). This is with the attack time a function of $\tau_A = R_{18} C_{21}$ and the release time a function of $\tau_R = R_{20} C_{21}$. Please note, that the transient response is no problem since $V_{AGC}$ does not materially affect the biasing of the amplifier to any significant degree. The fact that the FET is used in a feed back loop, in combination with the fact that it is a low Pinch-Off JFET contributes to an extremely clean simplified configuration that requires no additional AGC dc amplifier in providing highly successful operational results. These features also contribute to cost savings, operational reliability and improved service-ability in an audio compression circuit having voltage output db variation vs frequency characteristics as shown by FIG. 4.

Please note that with suitable polarity orintation of diode 19 coinsistent with use of a P or N channel depletion mode MOSFET in place of JFET 13 substantially the same operational results are provided.

Whereas this invention is here illustrated and described with respect to a specific embodiment thereof, it should be realized that various changes may be made without departing from the essential contributions to the art made by the teachings hereof.

I claim:

1. In an audio compression circuit with signal input coupling means, amplifying means, and output signal circuit means: a field effect semiconductor device having at least three electrode connections, first, second, and third electrode means connected in said signal input coupling means with a first to third electrode means input signal circuit path; an (AGC) automatic gain control circuit connected from said output signal circuit means to said second electrode means; wherein said second electrode means is a gate control electrode connection for the field effect semiconductor device; and wherein said AGC circuit includes voltage rectifying means; said AGC circuit also includes filter circuit means connected from the interconnection between said voltage rectifying means and said gate control electrode connection and ground; and capacitive means and resistive means connected in parallel from said interconnection to ground.

2. The audio compression circuit of claim 1, wherein said field effect semiconductor device is a low Pinch-Off JFET.

3. The audio compression circuit of claim 1, wherein resistive means is included in said AGC circuit between said output signal circuit means and said voltage rectifying means.

4. The audio compression circuit of claim 1, wherein said amplifying means is an operational amplifier circuit with a feedback output to input circuit connection with resistance value means $R_f$, and with closed-loop gain $$A_V = \frac{R_f}{R_{ds}}$$

(with $R_{ds}$ being drain-to-source output resistance) and, $R_{ds}$ is a function of the AGC voltage.

* * * * *